United States Patent [19]
Eckstein et al.

[11] Patent Number: 6,140,405
[45] Date of Patent: Oct. 31, 2000

[54] SALT-MODIFIED ELECTROSTATIC DISSIPATIVE POLYMERS

[75] Inventors: Yona Eckstein, Kent; Ramakrishna Ravikiran, North Royalton, both of Ohio

[73] Assignee: The B. F. Goodrich Company, Richfield, Ohio

[21] Appl. No.: 09/157,460

[22] Filed: Sep. 21, 1998

[51] Int. Cl.[7] .............................. C08K 3/10; C08K 3/30; C08K 3/38
[52] U.S. Cl. ......................... 524/419; 524/401; 524/404; 524/437
[58] Field of Search ..................... 524/414, 401, 524/415, 419; 428/323; 429/197; 264/104

[56] References Cited

U.S. PATENT DOCUMENTS

| | | | |
|---|---|---|---|
| 4,480,001 | 10/1984 | Cannady, Jr. et al. | 428/284 |
| 5,122,303 | 6/1992 | Tieke . | |
| 5,159,053 | 10/1992 | Kolycheck et al. . | |
| 5,188,783 | 2/1993 | Pierce | 264/104 |
| 5,342,889 | 8/1994 | Sullivan et al. . | |
| 5,574,104 | 11/1996 | Kolycheck et al. . | |
| 5,631,311 | 5/1997 | Bergmann et al. | 523/333 |
| 5,677,357 | 10/1997 | Spicher | 521/85 |
| 5,766,797 | 6/1998 | Crespi et al. | 429/197 |
| 5,858,264 | 1/1999 | Ichino et al. | 252/62.2 |

FOREIGN PATENT DOCUMENTS

| | | |
|---|---|---|
| 0368514 | 5/1990 | European Pat. Off. . |
| 443 767 A1 | 8/1991 | European Pat. Off. . |
| 453 929 A1 | 10/1991 | European Pat. Off. . |
| 0548741 | 3/1993 | European Pat. Off. ............ 71/2 |
| 548 741 A2 | 6/1993 | European Pat. Off. . |
| 378 700 B1 | 12/1993 | European Pat. Off. . |
| 1120725 | 7/1968 | United Kingdom . |
| 91/09906 | 7/1991 | WIPO . |

OTHER PUBLICATIONS

Solid Polymer Electrolytes *Fundamentals and Technological Applications*, Fiona M. Gray, 1991, pp. 48, 116–117.

*Primary Examiner*—Vasu Jagannathan
*Assistant Examiner*—Katarzyna Wyrozebski
*Attorney, Agent, or Firm*—Thoburn T. Dunlap; Daniel J. Hudak; David P. Dureska

[57] ABSTRACT

A low molecular weight polyether oligomer is modified with a salt during chain extending reaction of the polyether oligomer to form electrostatic dissipative polymer products such as polyurethanes, polyether amide block copolymers and polyether-ester block copolymers. The reaction product polymers exhibit relatively low surface and volume resistivities, and static decay times which are not too fast or too slow, yet are free of excessive amounts of extractable anions, particularly chlorine, nitrate, phosphate and sulfate. The electrostatic dissipative polymers can be blended with a variety of base polymers to form plastic alloys, which in turn can be utilized to form articles useful in the manufacture of electrostatic sensitive electronic devices.

20 Claims, No Drawings

SALT-MODIFIED ELECTROSTATIC DISSIPATIVE POLYMERS

BACKGROUND OF THE INVENTION

1. Field of the Invention

The present invention relates to electrostatic dissipative polymers, and in particular to salt-modified electrostatic dissipative polymers reacted from polyether oligomers. More particularly, the present invention is directed to salt-modified electrostatic dissipative polymers reacted from polyether oligomers, which exhibit relatively low surface and volume resistivities, but which are generally free of excessive amounts of extractable anions.

2. Background Art

The formation and retention of charges of static electricity on the surface of most plastics is well known. Plastic materials have a significant tendency to accumulate static electrical charges due to low electrical conductivity. This type of formation and retention of charges of static electricity can be problematic. The presence of static electrical charges on sheets of thermoplastic film, for example, can cause the sheets to adhere to one another thus making their separation for further processing more difficult. Moreover, the presence of static electrical charges causes dust to adhere to items packaged in a plastic bag for example, which may negate any sales appeal.

The increasing complexity and sensitivity of microelectronic devices makes the control of static discharge of particular concern to the electronics industry. Even a low voltage discharge can cause severe damage to sensitive devices. The need to control static charge buildup and dissipation often requires the entire assembly environment for these devices to be constructed of partially conductive materials. It also may require that electrostatic protective packages, tote boxes, casings, and covers be made from conductive polymeric materials to store, ship, protect, or support electrical devices and equipment.

The prevention of the buildup of static electrical charges which accumulate on plastics during manufacture or use has been accomplished by the use of various electrostatic dissipative (ESD) materials. These materials can be applied as a coating which may be sprayed or dip coated on the article after manufacture, although this method usually results in a temporary solution. Alternatively, these materials can be incorporated into a polymer used to make the article during processing, thereby providing a greater measure of permanence.

However, the incorporation of these lower molecular weight electrostatic dissipative materials (antistatic agents) into the various matrix or base polymers has its own limitations. For example, the high temperatures required for conventional processing of most polymers may damage or destroy the antistatic agents, thereby rendering them useless with respect to their ESD properties. Moreover, many of the higher molecular weight ESD agents are not miscible with the matrix or base polymers employed.

A large number of antistatic agents are also either cationic or anionic in nature. These agents tend to cause the degradation of plastics, particularly PVC, and result in discoloration or loss of physical properties. Other antistatic agents have significantly lower molecular weights than the base polymers themselves. Often these lower molecular weight antistatic agents possess undesirable lubricating properties and are difficult to incorporate into the base polymer. Incorporation of the lower molecular weight antistatic agents into the base polymers often will reduce the moldability of the base polymer because the antistatic agents can move to the surface of the plastic during processing and frequently deposit a coating on the surface of the molds, possibly destroying the surface finish on the articles of manufacture. In severe cases, the surface of the article of manufacture becomes quite oily and marbleized. Additional problems which can occur with lower molecular weight ESD agents are loss of their electrostatic dissipative capability due to evaporation, the development of undesirable odors, or promotion of stress cracking or crazing on the surface of an article in contact with the article of manufacture.

One of the known lower molecular weight antistatic agents is a homopolymer or copolymer oligomer of ethylene oxide. Generally, use of the lower molecular weight polymers of ethylene oxide or polyethers as antistatic agents are limited by the above-mentioned problems relative to lubricity, surface problems, or less effective ESD properties. Further, these low molecular weight polymers can be easily extracted or abraded from the base polymer thereby relinquishing any electrostatic dissipative properties, and in some instances can also produce undesirably large amounts of unwanted extractable anions, and in particular chlorine, nitrate, phosphate, and sulfate anions.

There are several examples of high molecular weight electrostatic dissipative agents in the prior art. In general, these additives have been high molecular weight polymers of ethylene oxide or a derivative thereof like propylene oxide, epichlorohydrin, glycidyl ethers, and the like. It has been a requirement that these additives be high molecular weight materials to overcome the problems mentioned above. However, these prior art ESD additives do not have a desired balance between electrical conductivity and acceptable low levels of extractable anions, in particular chlorine, nitrate, phosphate, and sulfate, which in turn can cause any manufactured articles containing such ESD additives to have unacceptable properties for some end uses.

The present invention solves the problem of obtaining electrostatic dissipative polymers or additives which exhibit relatively low surface and volume resistivities without unacceptably high levels of extractable anions, in particular chlorine, nitrate, phosphate, and sulfate anions. These electrostatic dissipative polymers in turn can be incorporated in base polymer compositions useful in the electronics industry without producing other undesirable properties in a finished article of manufacture.

SUMMARY OF INVENTION

The present invention relates to a polymer useful in forming a plastic alloy for use with an electronic device, the polymer including an effective amount of a salt, the salt being compatible with the polymer, the salt-modified polymer having a surface resistivity of from about $1.0 \times 10^6$ ohm/square to about $1.0 \times 10^{10}$ ohm/square as measured by ASTM D-257, and further the salt-modified polymer having less than about 8,000 parts per billion total extractable anions measured from the group of all four of chlorine anions, nitrate anions, phosphate anions, and sulfate anions, and less than about 1,000 parts per billion of said chlorine anions, less than about 100 parts per billion of said nitrate anions, less than about 6,000 parts per billion of said phosphate anions, and less than about 1,000 parts per billion of said sulfate anions.

DESCRIPTION OF THE PREFERRED EMBODIMENT

The present invention relates to salt-modified electrostatic dissipative polymers reacted from low molecular weight polyether oligomers, wherein the polymers display relatively low surface and volume resistivities, yet generally are free of excessive levels of extractable anions. The low molecular weight polyether oligomer useful in the present invention is described and prepared as follows.

The low molecular weight polyether oligomer useful in the present invention can comprise a homopolymer of ethylene oxide having a number average molecular weight of from about 200 to about 5000. The low molecular weight polyether oligomer can also comprise a copolymer of two or more copolymerizable monomers wherein one of the monomers is ethylene oxide and has a number average molecular weight from about 200 to about 20,000.

Exemplary of the comonomers which can be copolymerized with ethylene oxide are: 1,2-epoxypropane(propylene oxide); 1,2-epoxybutane; 2,3-epoxybutane(cis & trans); 1,2-epoxypentane; 2,3-epoxypentane(cis & trans); 1,2-epoxyhexane; 2,3-epoxyhextane(cis & trans); 3,4-epoxyhextane(cis & trans); 1,2-epoxy heptane; 1,2-epoxydecane; 1,2-epoxydodecane; 1,2-epoxyoctadecane; 7-ethyl-2-methyl-1,2-epoxyundecane; 2,6,8-trimethyl-1,2-epoxynonane; styrene oxide.

Other comonomers which can be used as comonomers with the ethylene oxide are: cyclohexene oxide; 6-oxabicyclo[3,1,0]-hexane; 7-oxabicyclo[4,1,0]heptane; 3-chloro-1,2-epoxybutane; 3-chloro-2,3-epxybutane; 3,3-dichloro-1,2-epoxypropane; 3,3,3-trichloro-1,2-epoxypropane; 3-bromo-1-2-epoxybutane, 3-fluoro-1,2-epoxybutane; 3-iodo-1,2-epoxybutane; 1,1-dichloro-1-fluoro-2,3-epoxypropane; 1-chloro-1,1-dichloro-2,3-epoxypropane; and 1,1,1,2-pentachloro-3,4-epoxybutane.

Typical comonomers with at least one ether linkage useful as comonomers are exemplified by: ethyl glycidyl ether; n-butyl glycidyl ether; isobutyl glycidyl ether; t-butyl glycidyl ether; n-hexyl glycidyl ether; 2-ethylhexyl glycidyl ether; heptafluoroisopropyl glycidyl ether, phenyl glycidyl ether; 4-methyl phenyl glycidyl ether; benzyl glycidyl ether; 2-phenylethyl glycidyl ether; 1,2-dihydropentafluoroisopropyl glycidyl ether; 1,2-trihydrotetrafluoroisopropyl glycidyl ether; 1,1-dihydrotetrafluoropropyl glycidyl ether; 1,1-dihydranonafluoropentyl glycidyl ether; 1,1-dihydropentadecafluorooctyl glycidyl ether; 1,1-dihydropentadecafluorooctyl-α-methyl glycidyl ether; 1,1-dihydropentadecafluorooctyl-β-methyl glycidyl ether; 1,1-dihydropentadecafluorooctyl-α-ethyl glycidyl ether; 2,2,2-trifluoro ethyl glycidyl ether.

Other comonomers with at least one ester linkage which are useful as comonomers to copolymerize with ethylene oxide are: glycidyl acetate; glycidyl chloroacetate; glycidyl butyrate; and glycidyl stearate; to name a few.

Typical unsaturated comonomers which can be polymerized with ethylene oxide are: allyl glycidyl ether; 4-vinylcyclohexyl glycidyl ether; α-terpinyl glycidyl ether; cyclohexenylmethyl glycidyl ether; p-vinylbenzyl glycidyl ether; allyphenyl glycidyl ether; vinyl glycidyl ether; 3,4-epoxy-1-pentene; 4,5-epoxy-2-pentene; 1,2-epoxy-5,9-cyclododeca diene; 3,4-epoxy-1-vinylchlohexene; 1,2-epoxy-5-cyclooctene; glycidyl acrylate; glycidyl methacrylate; glycidyl crotonate; glycidyl 4-hexenoate.

Other cyclic monomers suitable to copolymerize with ethylene oxide are cyclic ethers with four or more member-ring containing up to 25 carbon atoms except tetrahydropyran and its derivatives. Exemplary cyclic ethers with four or more member-ring are oxetane (1,3-epoxide), tetrahydrofuran (1,5-epoxide), and oxepane (1,6-epoxide) and their derivatives.

Other suitable cyclic monomers are cyclic acetals containing up to 25 carbon atoms. Exemplary cyclic acetals are trioxane, dioxolane, 1,3,6,9-tetraoxacycloundecane, trioxepane, troxocane, dioxepane and their derivatives.

Other suitable cyclic monomers are cyclic esters containing up to 25 carbon atoms. Exemplary cyclic esters are beta-valerolactone, epsilon-caprolactone, zeta-enantholactone, eta-caprylactone, butyrolactone and their derivatives. The low molecular weight polyether oligomer prepared by the method detailed immediately above then can be reacted with a variety of chain extenders and modified with a selected salt to form the electrostatic dissipative polymer additive or antistatic agent of the present invention.

For example, the polyether oligomer described immediately above can be reacted to form an electrostatic dissipative agent comprising a copolyether-ester polymer comprising one or more polyester blocks as well as one or more low molecular weight polyether oligomer blocks. The polyester block is generally made from an aromatic containing dicarboxylic acid or diester such as terephthalic acid, dimethyl terephthalate, and the like, with a diol generally containing from about 2 to about 10 carbon atoms. The low molecular weight polyether oligomer is generally made as described above. The polyether-ester block copolymers can be represented by the following formula:

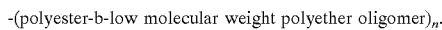

-(polyester-b-low molecular weight polyether oligomer)$_n$.

A preferred embodiment of the polyester-ether block copolymer comprises the reaction product of ethylene glycol, terephthalic acid or dimethyl terephthalate and polyethylene glycol. These and other examples of other polyester-ether copolymers which can be utilized are set forth in the *Encyclopedia of Polymer Science and Engineering*, Vol. 12, John Wiley & Sons, Inc., NY, N.Y., 1988, pages 49–52, which is hereby fully incorporated by reference as well as U.S. Pat. Nos. 2,623,031; 3,651,014; 3,763,109; and 3,896,078.

Alternatively, the low molecular weight polyether oligomer can be reacted to form an electrostatic dissipative agent comprising one or more polyamide blocks as well as one or more low molecular weight polyether oligomer blocks. Alternatively, the low molecular weight polyether oligomer may be reacted with the polyamide in the presence of a diacid to form a polyether ester amide having the recurring formula:

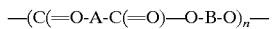

—(C(=O-A-C(=O)—O-B-O)$_n$— where A is the polyamide and B is the low molecular weight polyether oligomer. Further information on this polymer can be found in U.S. Pat. No. 4,332,920, incorporated herein by reference.

Examples of commercially available compositions containing the low molecular weight polyether oligomers which can be modified with salt as contemplated by the present invention, include Stat-Rite® C-2300 ESD agents, available from the B.F. Goodrich Company; Pebax MX 1074, and Pebax 4011 MA, available from Elf Atochem Company, Engineered Polymers Division; and Hytrel 8099, Hytrel 8206, Hytrel 8171 and Hytrel 3548, available from DuPont Company and Hydrin 200, available from Nippon Zeon.

In a preferred embodiment of the present invention, the low molecular weight polyether oligomer can be reacted to form a polyurethane electrostatic dissipative agent, such as the Stat-Rite® C-2300 ESD agent available from the B.F. Goodrich Company. More specifically, the polyurethane electrostatic dissipative additive comprises the reaction of a hydroxyl terminated ethylene ether oligomer intermediate with a non-hindered diisocyanate and an extender glycol, where the oligomer can be a diethylene glycol-aliphatic polyester, or a polyethylene glycol.

Referring first to the polyester intermediate, a hydroxyl terminated, saturated polyester polymer is synthesized by reacting excess equivalents of diethylene glycol with considerably lesser equivalents of an aliphatic, preferably an alkyl, dicarboxylic acid having four to ten carbon atoms where the most preferred is adipic acid. Other useful dicarboxylic acids include succinic, glutaric, pimelic, suberic, azelaic and sebacic acids. The most preferred polyester intermediate is polydiethylene glycol adipate. In accordance with this aspect of the present invention, excess moles of diethylene glycol are reacted with lesser moles of dicarboxylic acid at levels from about 5 mole percent to about 50 mole percent excess of glycol to provide a hydroxyl terminated polyester oligomer chain having an average molecular weight between about 500 to 5000 and preferably between about 700 and 2500. The short chain polyester oligomer contains repeating diethylene ether structures and comprises on an equivalent basis from about 1.05 to 1.5 equivalents of diethylene glycol co-reacted with one equivalent of dicarboxylic acid to produce the low molecular weight polyester oligomer intermediate. The high excess equivalents of diethylene glycol controls the molecular weight of the polyester oligomer preferably below 2500 and further assures a hydroxyl terminated linear polyester oligomer. The polyester oligomers synthesized by reacting the diethylene glycol with lesser equivalents of dicarboxylic acid at temperatures of from about 300° F. to 450° F. in the absence or in the presence of an esterification catalyst such as stannous chloride for time sufficient to reduce the Acid No. to about zero.

The hydroxyl terminated polyester oligomer intermediate is further reacted with considerably excess equivalents of non-hindered diisocyanate along with extender glycol in a so-called one-shot or simultaneous coreaction of oligomer, diisocyanate, and extender glycol to produce the very high molecular weight linear polyurethane having an average molecular weight broadly from about 60,000 to about 500,000, preferably from about 80,000 to about 180,000, and most preferably from about 100,000 to about 180,000.

Alternatively, an ethylene ether oligomer glycol intermediate comprising a polyethylene glycol can be co-reacted with non-hindered diisocyanate and extender glycol to produce the high molecular weight, polyurethane polymer. Useful polyethylene glycols are linear polymers of the general formula H—(OCH$_2$CH$_2$)—$_n$OH where n is the number of repeating ethylene ether units and n is at least 11 and between 11 and about 115. On a molecular weight basis, the useful range of polyethylene glycols have an average molecular weight from about 500 to about 5000 and preferably from about 700 to about 2500. Commercially available polyethylene glycols useful in this invention are typically designated as polyethylene glycol 600, polyethylene glycol 1500, and polyethylene glycol 4000.

In accordance with this invention, high molecular weight thermoplastic polyurethanes are produced by reacting together preferably in a one-shot process the ethylene ether oligomer glycol intermediate, an aromatic or aliphatic non-hindered diisocyanate, and an extender glycol. On a mole basis, the amount of extender glycol for each mole of oligomer glycol intermediate is from about 0.1 to about 3.0 moles, desirably from about 0.2 to about 2.1 moles, and preferably from about 0.5 to about 1.5 moles. On a mole basis, the high molecular weight polyurethane polymer comprises from about 0.97 to about 1.02 moles, and preferably about 1.0 moles of non-hindered diisocyanate for every 1.0 total moles of both the extender glycol and the oligomer glycol (i.e. extender glycol+oligomer glycol−1.0).

Useful non-hindered diisocyanates comprise aromatic non-hindered diisocyanates and include, for example, 1,4-diisocyanatobenzene (PPDI), 4,4'-methylene-bis(phenyl isocyanate) MDI), 1,5-naphthalene diisocyanate (NDI), m-xylene diisocyanate (XDI), as well as non-hindered, cyclic aliphatic diisocyanates such as 1,4-cyclohexyl diisocyanate (CHDI), and H$_{12}$ MDI. The most preferred diisocyanate is MDI. Suitable extender glycols (i.e. chain extenders) are aliphatic short chain glycols having two to six carbon atoms and containing only primary alcohol groups. Preferred glycols include diethylene glycol, 1,3-propane diol, 1,4-butane diol, 1,5-pentane diol, 1,4-cyclohexane-dimethanol, hydroquinone di(hydroxyethyl)ether, and 1,6-hexane diol with the most preferred glycol being 1,4-butane diol.

In accordance with the present invention, the hydroxyl terminated ethylene ether oligomer intermediate, the non-hindered diisocyanate, and the aliphatic extender glycol are co-reacted simultaneously in a one-shot polymerization process at a temperature above about 100° C. and usually about 120° C., whereupon the reaction is exothermic and the reaction temperature is increased to about 200° C. to above 250° C.

In accordance with a key feature of the present invention, an effective amount of a salt, salt complex or salt compound formed by the union of a metal ion with a non-metallic ion or molecule is added during the one-shot polymerization process. While the exact mechanism of attachment and/or attraction of the salt to the ESD polymer reaction product is not completely understood, the salt unexpectedly improves the surface and volume resistivities of the resulting polymer without the presence of unacceptably high levels of extractable anions. Moreover, the static decay times remain in an acceptable range, that is, the times are not too fast or too slow. Examples of salts useful in the subject invention include: LiClO$_4$, LiN(CF$_3$SO$_2$)$_2$, LiPF$_6$, LiAsF$_6$, LiI, LiBr, LiSCN, LiSO$_3$CF$_3$, LiNO$_3$, LiC(SO$_2$CF$_3$)$_3$, Li$_2$S, and LiMR$_4$ where M is Al or B, and R is a halogen, alkyl or aryl group. The preferred salt is Li N(CF$_3$SO$_2$)$_2$, which is commonly referred to as lithium trifluoromethane sulfonimide. The effective amount of the selected salt added to the one-shot polymerization is at least about 0.10 parts based on 100 parts of the polymer, desirably at least about 0.25 parts and preferably at least about 0.75 parts.

In accordance with another important feature of the present invention, it has been discovered that the amount of salt utilized can be unexpectedly lowered when the salt is added in conjunction with an effective amount of a co-solvent. Examples of co-solvents suitable for this purpose include ethylene carbonate, propylene carbonate, dimethyl sulfoxide, tetramethylene sulfone, tri- and tetra ethylene glycol dimethyl ether, gamma butyrolactone, and N-methyl-2-pyrrolidone. Ethylene carbonate is preferred. Although the addition of one of the co-solvents is optional, in some applications lower amounts of the salt may be desirable. The effective amount of co-solvent required to achieve the desired result of lower salt usage while still attaining the desired properties in the ESD polymer, is at least about 0.10 parts based on 100 parts of the polymer, preferably at least about 0.50 parts, and most preferably at least about 1.0 parts. Thus, it is unexpectedly found that addition of the co-solvent together with a lowered amount of the salt synergistically lowers the surface and volume resistivities of the ESD polymer, without adversely affecting the presence of only relatively low amounts of extractable anions, in a manner similar to that which is observed when slightly higher amounts of the salt alone are added to the polymerization.

The salt-modified electrostatic dissipative polymer of the present invention can be blended with a matrix or base polymer comprising a homopolymer or a copolymer of a polyvinyl chloride, chlorinated polyvinyl chloride, copolymers of styrene and acrylonitrile, terpolymers of styrene, acrylonitrile and diene rubber, copolymers of styrene and acrylonitrile modified with an acrylate elastomer, copolymers of styrene and acrylonitrile modified with ethylene propylene diene monomer rubber, polystyrene and rubber modified impact polystyrene, nylon, polycarbonate, thermoplastic polyesters including polybutylene terephthalate, polyethylene terephthalate and polyether-ester block copolymers, polyurethane, polyphenylene oxide, polyacetatal, polymethyl methacrylate, polypropylene, polyethylene, and polyether amide block copolymer. The preferred ratio of the ESD polymer agent or additive to the base polymer is about 25 parts of ESD additive based on 100 parts of the ESD additive/base polymer blend. The preferred base polymer is polyethylene terephthalate and is available from Eastman Chemical Products, Inc., of Kingsport, Tenn.

The above-described process for forming the salt-modified electrostatic dissipative polymer of the present invention, which can in turn be blended with base polymers for use in forming finished articles having properties which make the articles useful in the electronics industry, can be better understood by the following examples.

EXAMPLES

Example 1

The preferred salt-modified polyurethane ESD polymer additive of the present invention was prepared by chain extending a polyethylene glycol oligomer, in the manner described hereinabove. The salt was added during the one-shot polymerization of the polyethylene glycol, diisocyanate and the aliphatic extender glycol to form the polyurethane polymer, as also detailed hereinabove. For the sake of relative completeness, it should be noted that the only difference between the polymers of Control X and Control Y, and of the modified samples 102–104 and 105–116, respectively, made therefrom, is that Control X was made from a single polyethylene glycol oligomer having an average molecular weight of 1,450, and Control Y was made from a pair of polyethylene glycol oligomers, one having an average molecular weight of 1,450 and the other having an average molecular weight of 3,350. The prepared polymers and salt and/or co-solvent modified samples made therefrom then were analyzed according to ASTM D-257 for surface and volume resistivities, the results of which are set forth in Table I. The same samples also were measured for levels of certain undesirable extractable anions as set forth in Table II as well as for static decay times as set forth in Table III. The results show that surface resistivities in the range of from about $1 \times 10^7$ to about $1 \times 10^9$ ohm/square and volume resistivities in the range of from about $1 \times 10^6$ to about $1 \times 10^9$ ohm.cm were obtained by adding a salt during polymerization. These resistivities unexpectedly are significantly lower than the surface and volume resistivities of unmodified Controls X and Y. The results in Table I also show that when ethylene carbonate co-solvent alone is added to a control polymer (see sample ID 105) the resistivities actually increase. However, when the same co-solvent is added in combination with the same or lower levels of the salt than the salt level used when the salt is added by itself, the significantly improved resistivities are unexpectedly again observed. Also unexpectedly, and as shown in Table II, the amount of extractable anions remained low in the salt-modified samples 102–104 of Control Polymer X, which itself exhibits low levels of the listed extractable anions. Surprisingly, the addition of Li-TFMSA salt alone and the salt together with ethylene carbonate co-solvent to samples 108–116 of Control Polymer Y, which itself exhibits relatively high levels of the listed anions, significantly lowers the levels of the individually listed extractable anions as well as the grand total amount of all four anions in samples 108–116, over those levels found in Control Polymer Y. Finally, static decay times shown in Table III fell within a range which was not too fast or too slow, of from about $1 \times 10^{-1}$ seconds to about $2.5 \times 10^{-1}$ seconds.

TABLE I

SURFACE AND VOLUME RESISTIVITY OF STATIC DISSIPATIVE POLYURETHANE POLYMERS

| Sample ID | Salt | Parts* | Surface ohm/sq. | Volume ohm · cm |
|---|---|---|---|---|
| Control X | none | 0 | $1.2 \times 10^{10}$ | $2.70 \times 10^9$ |
| 102 | Li-TFMSA | 2 | $3.10 \times 10^7$ | $4.00 \times 10^6$ |
| 103 | Li-TFMSA | 1 | $1.30 \times 10^8$ | $1.90 \times 10^7$ |
| 104 | Li-TFMSA | 1 | $3.30 \times 10^7$ | $5.20 \times 10^6$ |
|  | Eth. Carb. | 2 |  |  |
| Control Y | none | 0 | $7.80 \times 10^9$ | $1.60 \times 10^9$ |
| 105 | Eth. Carb. | 2 | $1.20 \times 10^{10}$ | $2.90 \times 10^9$ |
| 108 | Li-TFMSA | 0.25 | $1.80 \times 10^8$ | $4.20 \times 10^7$ |
|  | Eth. Carb. | 1 |  |  |
| 109 | Li-TFMSA | 0.25 | $1.40 \times 10^8$ | $3.00 \times 10^7$ |
|  | Eth. Carb. | 3 |  |  |
| 110 | Li-TFMSA | 0.5 | $3.40 \times 10^8$ | $1.60 \times 10^8$ |
| 111 | Li-TFMSA | 0.5 | $8.60 \times 10^7$ | $1.80 \times 10^7$ |
|  | Eth. Carb. | 1 |  |  |
| 112 | Li-TFMSA | 0.5 | $6.50 \times 10^7$ | $1.50 \times 10^7$ |
|  | Eth. Carb. | 3 |  |  |
| 113 | Li-TFMSA | 1 | $5.70 \times 10^7$ | $8.10 \times 10^6$ |
| 114 | Li-TFMSA | 1 | $4.80 \times 10^7$ | $8.60 \times 10^6$ |
|  | Eth. Carb. | 1 |  |  |
| 115 | Li-TFMSA | 1 | $3.30 \times 10^7$ | $9.10 \times 10^6$ |
|  | Eth. Carb. | 3 |  |  |
| 116 | Li-TFMSA | 2 | $3.00 \times 10^7$ | $8.90 \times 10^6$ |

*Parts of salt based on 100 parts of polymer.
Li-TFMSA = Lithium - trifluoromethane sulfinimide
Eth. Carb. = Ethylene Carbonate

TABLE II

EXTRACTABLE ANIONS* (nanograms/centimeter$^2$ (parts per billion) OF EXTRACTED COMPOUND) FROM STATIC DISSIPATIVE URETHANE POLYMER

| Sample ID | Salt | Parts** | Cl$^-$ | NO3$^-$ | HP04$^-$ | SO4$^-$ | Totals*** |
|---|---|---|---|---|---|---|---|
| Control X | none | 0 | 97.5 | 23.75 | 1312.5 | 38.75 | 1472.5 |
| 102 | Li-TFMSA | 2 | 346.25 | 37.5 | 620 | 262.5 | 1266.25 |

TABLE II-continued

EXTRACTABLE ANIONS* (nanograms/centimeter² (parts per billion) OF EXTRACTED COMPOUND) FROM STATIC DISSIPATIVE URETHANE POLYMER

| Sample ID | Salt | Parts** | Cl⁻ | NO3⁻ | HP04⁻ | SO4⁻ | Totals*** |
|---|---|---|---|---|---|---|---|
| 103 | Li-TFMSA | 1 | 75 | <31.25 | 1587.5 | 83.75 | 1777.5 |
| 104 | Li-TFMSA Eth. Carb. | 1 2 | 68.75 | 31.25 | 3162.5 | 68.75 | 3331.5 |
| Control Y | none | 0 | 1022.5 | 103.75 | 6010 | 108.75 | 7245 |
| 105 | none Eth. Carb. | 0 2 | 248.75 | 98.75 | 3045 | 155 | 3547.5 |
| 108 | Li-TFMSA Eth. Carb. | 0.25 1 | 33.75 | <31.25 | 3297.5 | 80 | 3442.5 |
| 109 | Li-TFMSA Eth. Carb. | 0.25 3 | 18.75 | <31.25 | 3105 | 97.5 | 3252.5 |
| 110 | Li-TFMSA | 0.5 | 210 | 72.5 | 4061.25 | 226.25 | 4570 |
| 111 | Li-TFMSA Eth. Carb. | 0.5 1 | 48.75 | 36.25 | 3431.25 | 163.75 | 3680 |
| 112 | Li-TFMSA Eth. Carb. | 0.5 3 | 25 | <31.25 | 3887.5 | 85 | 4028.75 |
| 113 | Li-TFMSA | 1 | 148.75 | 57.5 | 3956.25 | 118.75 | 4281.25 |
| 114 | Li-TFMSA Eth. Carb. | 1 1 | 43.75 | <31.25 | 2851.25 | 100 | 3026.25 |
| 115 | Li-TFMSA Eth. Carb. | 1 3 | 43.75 | <31.25 | 2992.5 | 61.25 | 3128.75 |
| 116 | Li-TFMSA | 2 | 328.75 | 30 | 5300 | 445 | 6103.75 |

*Measured by placing an 8 centimeter square, 40 mil thickness sample of the polyurethane polymer, in 10 ml. of deionized water, then heating for 1 hour at 85° C.
**Parts of salt based on 100 parts of polymer.
***Of all four anions
Li-TFMSA = Lithium - trifluoromethane sulfinimide
Eth. Carb. = Ethylene Carbonate

TABLE III

STATIC DECAY TIMES* (in seconds) at 1000 V (51% relative humidity) AND 5000 V (11.5% relative humidity) OF STATIC DISSIPATIVE URETHANE POLYMER

| Sample ID | Salt | Parts** | +1 KV | -1 KV | +5 KV | -5 KV |
|---|---|---|---|---|---|---|
| Control X | none | 0 | 0.1 | 0.2 | 0.10 | 0.22 |
| 102 | Li-TFMSA | 2 | 0.1 | 0.1 | 0.10 | 0.10 |
| 103 | Li-TFMSA | 1 | 0.1 | 0.1 | 0.10 | 0.16 |
| 104 | Li-TFMSA Eth. Carb. | 1 2 | 0.1 | 0.1 | 0.10 | 0.16 |
| Control Y | none | 0 | 0.2 | 0.2 | 0.10 | 0.14 |
| 105 | none Eth. Carb. | 0 2 | 0.4 | 0.3 | 0.22 | 0.20 |
| 108 | Li-TFMSA Eth. Carb. | 0.25 1 | 0.1 | 0.1 | 0.10 | 0.10 |
| 109 | Li-TFMSA Eth. Carb. | 0.25 3 | 0.1 | 0.1 | 0.10 | 0.10 |
| 110 | Li-TFMSA | 0.5 | 0.1 | 0.1 | 0.10 | 0.18 |
| 111 | Li-TFMSA Eth. Carb. | 0.5 1 | 0.1 | 0.1 | 0.10 | 0.16 |
| 112 | Li-TFMSA Eth. Carb. | 0.5 3 | 0.1 | 0.1 | 0.10 | 0.14 |
| 113 | Li-TFMSA | 1 | 0.1 | 0.1 | 0.10 | 0.20 |
| 114 | Li-TFMSA Eth. Carb. | 1 1 | 0.1 | 0.1 | 0.10 | 0.16 |
| 115 | Li-TFMSA Eth. Carb. | 1 3 | 0.1 | 0.1 | 0.10 | 0.10 |
| 116 | Li-TFMSA | 2 | 0.1 | 0.1 | 0.10 | 0.12 |

*Measured according to FTMS 1001 C for 5000 V values, and measurements at 1000 V were with charged plate monitor.
**Parts of salt based on 100 parts of polymer.
Li-TFMSA = Lithium - trifluoromethane sulfinimide
Eth. Carb. = Ethylene Carbonate While in accordance with the Patent Statutes, the best mode and preferred embodiments have been set forth, the scope of the invention is not limited thereto, but rather by the scope of the attached claims.

What is claimed is:

1. A polymer useful in forming a plastic alloy for use with an electronic device, said polymer comprising:
    an effective amount of a salt for electrostatic dissipation, wherein said salt is one or more of lithium trifluoromethane sulfonimide, $LiSO_3CF_3$, $LiC(SO_2CF_3)_3$, and $LiMR_4$ wherein M is Al or B, and R is a halogen, alkyl or aryl group; and an effective amount of a co-solvent for said salt; and
    wherein said polymer has a surface resistivity of from about $1.0 \times 10^6$ ohm/square to about $1.0 \times 10^{10}$ ohm/square as measured by ASTM D-257, and wherein said polymer has a volume resistivity of from about $1.0 \times 10^6$ ohm-centimeter to about $1.0 \times 10^{10}$ ohm-centimeter as measured by ASTM D-257; and wherein said polymer has less than about 8,000 parts per billion total extractable anions measured from the group of all four of chlorine anions, nitrate anions, phosphate anions and sulfate anions, and less than about 1,000 parts per billion of said chlorine anions, less than about 100 parts per billion of said nitrate anions, less than about 6,000 parts per billion of said phosphate anions, and less than about 1,000 parts per billion of said sulfate anions.

2. The polymer of claim 1, in which said polymer has less than about 7,200 parts per billion total extractable anions measured from the group of all four of chlorine anions, nitrate anions, phosphate anions, and sulfate anions, and less than about 700 parts per billion of said chlorine anions, less than about 90 parts per billion of said nitrate anions, less than about 5,700 parts per billion of said phosphate anions, and less than about 750 parts per billion of said sulfate anions.

3. The polymer of claim 2, in which said polymer has less than about 6,200 parts per billion total extractable anions measured from the group of all four of chlorine anions, nitrate anions, phosphate anions, and sulfate anions, and less than about 350 parts per billion of said chlorine anions, less than about 75 parts per billion of said nitrate anions, less than about 5,350 parts per billion of said phosphate anions, and less than about 450 parts per billion of said sulfate anions.

4. The polymer of claim 1, in which said polymer has a volume resistivity of from about $1.0 \times 10^6$ to about $1.0 \times 10^9$.

5. The polymer of claim 4, in which said polymer has a volume resistivity of from about $1.0 \times 10^7$ to about $1.0 \times 10^8$.

6. The polymer of claim 1, in which said polymer has a surface resistivity of from about $1.0 \times 10^6$ to about $1.0 \times 10^9$.

7. The polymer of claim 6, in which said polymer has a surface resistivity of from about $1.0 \times 10^7$ to about $1.0 \times 10^8$.

8. The polymer of claim 1, in which said effective amount of said salt is at least about 0.1 parts based on 100 parts of said polymer.

9. The polymer of claim 8, in which said effective amount of said salt is at least about 0.25 parts.

10. The polymer of claim 9, in which said effective amount of said salt is at least about 0.75 parts.

11. The polymer of claim 1, in which said effective amount of said co-solvent is at least about 0.1 parts based on 100 parts of said polymer.

12. The polymer of claim 11, in which said effective amount of said co-solvent is at least about 0.5 parts based on 100 parts of said polymer.

13. The polymer of claim 12, in which said effective amount of said co-solvent is at least about 1 part based on 100 parts of said polymer.

14. The polymer of claim 1, in which said co-solvent is one or more of ethylene carbonate, propylene carbonate, dimethyl sulfoxide, tetramethylene sulfone, tri- and tetra-ethylene glycol dimethyl ether, gamma butyrolactone, or N-methyl-2-pyrrolidone.

15. The polymer of claim 14, in which said co-solvent is ethylene carbonate.

16. The polymer of claim 1, in which said salt is lithium trifluoromethane sulfonimide.

17. The polymer of claim 1, in which said polymer is the reaction product of a chain extended polyether oligomer.

18. The polymer of claim 17 in which said polymer is one or more of thermoplastic polyurethane, polyether amide block copolymer, or polyetherester block copolymers.

19. The polymer of claim 18, in which said polymer comprises thermoplastic polyurethane.

20. The polymer of claim 1, in which said polymer has a static decay time at 1000 V and 51 percent relative humidity of from about $1.0 \times 10^{-1}$ to about $2.5 \times 10^{-1}$ as measured using a charged plate monitor; and in which said polymer has a static decay time at 5000 V and 11.5 percent relative humidity of from about $1.0 \times 10^{-1}$ to about $2.5 \times 10^{-1}$ as measured by FTMS 1001C.

* * * * *